US011662609B2

(12) United States Patent
Tran et al.

(10) Patent No.: US 11,662,609 B2
(45) Date of Patent: May 30, 2023

(54) WEARABLE AUDIO DEVICE WITH CABLE-THROUGH HINGE

(71) Applicant: Bose Corporation, Framingham, MA (US)

(72) Inventors: An Tran, Austin, TX (US); Bennett Alexander Nadeau, Austin, TX (US); Keith L. Davidson, Brighton, MA (US); Brandon Leo Hicks, Ludlow, MA (US); Annu Kuriakose, Waltham, MA (US); Edgardo Alicea, Brockton, MA (US); Dallas Robert Tharrett, Norfolk, MA (US)

(73) Assignee: Bose Corporation, Framingham, MA (US)

( * ) Notice: Subject to any disclaimer, the term of this patent is extended or adjusted under 35 U.S.C. 154(b) by 398 days.

(21) Appl. No.: 16/778,132

(22) Filed: Jan. 31, 2020

(65) Prior Publication Data

US 2021/0240013 A1 Aug. 5, 2021

(51) Int. Cl.
*H04R 25/00* (2006.01)
*G02C 11/00* (2006.01)
(Continued)

(52) U.S. Cl.
CPC ............. *G02C 11/10* (2013.01); *G02C 5/143* (2013.01); *G02C 5/22* (2013.01); *H04R 1/08* (2013.01);
(Continued)

(58) Field of Classification Search
CPC ................................ H04R 25/00; H04R 1/105
(Continued)

(56) References Cited

U.S. PATENT DOCUMENTS 5,606,743 A 2/1997 Vogt et al.
6,769,767 B2 8/2004 Swab et al.
(Continued)

FOREIGN PATENT DOCUMENTS

CN 201673332 U 12/2010
EP 1001302 A1 5/2000
(Continued)

OTHER PUBLICATIONS

PCT International Search Report and Written Opinion for International Application No. PCT/US2021/015399, dated Mar. 25, 2021, 14 pages.
(Continued)

*Primary Examiner* — Suhan Ni
(74) *Attorney, Agent, or Firm* — Hoffman Warnick

(57) ABSTRACT

Various aspects include wearable audio devices with through-hinge wiring configurations. In particular aspects, a wearable audio device includes a hinge coupling a first section and one additional section; and a cable extending through the hinge. In various implementations, the hinge is overmolded on the cable and includes: a body defining a cavity accommodating the cable with a first opening to a pathway in the first section, and a second opening to an additional pathway in the one additional section; an insert within the body and adjacent the first opening, the insert defining a minimum radius of a bend in the cable within the cavity; a hinge mechanism contained within the body; and a cable management feature contained within the body, wherein the hinge mechanism, cable management feature and cable are all located in a common plane that is radially oriented relative to the primary axis of the hinge mechanism.

22 Claims, 13 Drawing Sheets

(51) Int. Cl.
  *H04R 1/10* (2006.01)
  *G02C 5/14* (2006.01)
  *H04R 5/033* (2006.01)
  *H04R 1/08* (2006.01)
  *H05K 1/02* (2006.01)
  *G02C 5/22* (2006.01)

(52) U.S. Cl.
  CPC ......... *H04R 1/1033* (2013.01); *H04R 1/1066* (2013.01); *H04R 5/0335* (2013.01); *H05K 1/028* (2013.01)

(58) Field of Classification Search
  USPC .......................................... 381/327, 375, 381
  See application file for complete search history.

(56) References Cited

U.S. PATENT DOCUMENTS

| | | | |
|---|---|---|---|
| 7,760,898 B2 * | 7/2010 | Howell | H04R 5/0335 381/381 |
| 9,740,023 B1 | 8/2017 | Ashwood | |
| 10,353,221 B1 * | 7/2019 | Graff | H04R 1/105 |
| 10,761,346 B1 | 9/2020 | Yang et al. | |
| 2002/0163486 A1 | 11/2002 | Ronzani et al. | |
| 2007/0121061 A1 | 5/2007 | Kim | |
| 2007/0248238 A1 | 10/2007 | Abreu | |
| 2008/0013041 A1 | 1/2008 | Chou | |
| 2009/0180194 A1 | 7/2009 | Yamaguchi et al. | |
| 2010/0045928 A1 | 2/2010 | Levy | |
| 2010/0110368 A1 | 5/2010 | Chaum | |
| 2010/0177277 A1 | 7/2010 | Kokonaski et al. | |
| 2012/0127420 A1 | 5/2012 | Blum et al. | |
| 2012/0262667 A1 | 10/2012 | Willey | |
| 2013/0235331 A1 | 9/2013 | Heinrich et al. | |
| 2013/0250135 A1 | 9/2013 | Blum et al. | |
| 2014/0028966 A1 | 1/2014 | Blum et al. | |
| 2016/0048036 A1 | 2/2016 | Cazalet | |
| 2017/0108713 A1 | 4/2017 | Blum et al. | |
| 2018/0049664 A1 | 2/2018 | Miyazaki | |
| 2018/0070812 A1 | 3/2018 | Miyazaki | |
| 2018/0095299 A1 | 4/2018 | Cazalet et al. | |
| 2019/0235274 A1 | 8/2019 | Ludovic et al. | |
| 2020/0041821 A1 | 2/2020 | Graff et al. | |
| 2020/0174281 A1 | 6/2020 | Gui et al. | |
| 2021/0240013 A1 | 8/2021 | Hicks et al. | |
| 2021/0263334 A1 | 8/2021 | Moskowitz et al. | |

FOREIGN PATENT DOCUMENTS

| | | |
|---|---|---|
| FR | 2703477 A1 | 10/1994 |
| WO | 2013188805 A2 | 12/2013 |
| WO | 2020028529 A1 | 2/2020 |

OTHER PUBLICATIONS

PCT International Search Report and Written Opinion for International Application No. PCT/US2021/026182, dated Jul. 8, 2021, 15 pages.

* cited by examiner

WEARABLE AUDIO DEVICE WITH CABLE-THROUGH HINGE

TECHNICAL FIELD

This disclosure generally relates to audio eyeglasses. More particularly, the disclosure relates to audio eyeglasses with through-hinge wiring.

BACKGROUND

Providing power and communications between components in electronic devices often involves running one or more cables through physically distinct sections of a housing or frame. In cases where the electronic device includes a hinge (e.g., in a wearable audio device) it can be challenging to design the hinge for accommodating the cable as well as the hinge mechanism.

SUMMARY

All examples and features mentioned below can be combined in any technically possible way.

Various implementations of the disclosure include wearable audio devices such as audio eyeglasses or an audio headset with through-hinge wiring configurations. In particular aspects, a wearable audio device includes a hinge coupling a first section and one additional section; and a cable extending through the hinge. The hinge is overmolded on the cable and includes: a body defining a cavity accommodating the cable, the cavity having a first opening to a pathway in the first section, and a second opening to an additional pathway in the one additional section; an insert within the body and adjacent the first opening, the insert defining a minimum radius of a bend in the cable within the cavity; a hinge mechanism contained within the body; and a cable management feature contained within the body, where the hinge mechanism, the cable management feature and the cable are all located in a common plane that is radially oriented relative to the primary axis of the hinge mechanism.

In some particular aspects, a wearable audio device includes: a frame for resting on a head of a user, the frame having: a first section; an additional section extending from the first section; a hinge coupling the first section and the additional section; and a cable extending through the hinge, where the hinge is overmolded on the cable and includes: a body defining a cavity accommodating the cable, the cavity having a first opening to a pathway in the first section, and a second opening to an additional pathway in the additional section; an insert within the body and adjacent the first opening, the insert defining a minimum radius of a bend in the cable within the cavity; a hinge mechanism contained within the body; and a cable management feature contained within the body, where the hinge mechanism, the cable management feature and the cable are all located in a common plane that is radially oriented relative to the primary axis of the hinge mechanism.

In other particular aspects, a wearable audio device includes: a frame for resting on a head of a user, the frame including: a first section; an additional section extending from the first section; a hinge coupling the first section and the additional section; and a cable extending through the hinge, where the hinge is overmolded on the cable and includes: a body defining a cavity accommodating the cable, the cavity having a first opening to a pathway in the first section, and a second opening to an additional pathway in the one additional section; and an insert within the body and adjacent the first opening, the insert defining a minimum radius of a bend in the cable within the cavity.

In additional particular aspects, a wearable audio device includes: a frame for resting on a head of a user, the frame having: a first section; an additional section extending from the first section; a hinge coupling the first section and the additional section; and a cable extending through the hinge, where a portion of the hinge is overmolded on the cable and includes: a body defining a cavity accommodating the cable, the cavity having a first opening to a pathway in the first section, and a second opening to an additional pathway in the additional section; a hinge mechanism contained within the body; and a cable management feature contained within the body, where the hinge mechanism, the cable management feature and the cable are all located in a common plane that is radially oriented relative to the primary axis of the hinge mechanism.

Implementations may include one of the following features, or any combination thereof.

In certain implementations, the wearable audio device includes audio eyeglasses, where the first section includes a lens region, the additional section includes an arm, and the hinge couples the lens region with the arm.

In some aspects, a portion of the hinge is fixed within a slot in the lens region.

In particular cases, the wearable audio device includes a headset, where the first section includes a headband, the additional section includes an earphone, and the hinge couples the headband with the earphone.

In certain aspects, the wearable audio device includes: an electro-acoustic transducer at least partially housed in the frame and including a sound-radiating surface for providing an audio output.

In particular implementations, the hinge permits movement of the additional section relative to the first section.

In certain cases, the wearable audio device further includes at least one microphone in the first section or the additional section.

In some aspects, the cable includes a flexible printed circuit (FPC), and the FPC is thinner in a region contained within the hinge than in a distinct region within the pathway or the additional pathway.

In particular implementations, the body of the hinge includes an overmolded plastic, and the insert is non-unitary with the body.

In certain cases, the overmolded body of the hinge envelops the insert.

In some aspects, the cable wraps around the hinge mechanism radially outboard relative to a primary axis of the hinge mechanism about which the additional section moves relative to the first section, and the common plane is radially oriented relative to the primary axis.

In particular implementations, the body of the hinge includes an overmolded plastic, the insert is non-unitary with the body, and the overmolded body of the hinge envelops the insert.

In certain aspects, the hinge includes a metal ledge separating the first section and the additional section.

In particular implementations, the metal ledge is visible around an entirety of an interface between the first section and the additional section while the hinge is in a fully open position.

In some cases, the metal ledge remains stationary and in contact with the second section throughout an entire range of motion of the hinge.

In some implementations, the cable management feature and the hinge mechanism are unitary and formed of a metal.

In certain cases, the hinge includes a set of mating features that are coupled with a complementary set of mating features in the additional section.

In particular aspects, the mating features in the additional section include a set of ribs.

In some implementations, the hinge includes a thinned section extending through a complementary slot in the additional section, where the mating features are located within the body of the additional section on a first side of the slot and the cable management feature is located on a second side of the slot.

Two or more features described in this disclosure, including those described in this summary section, may be combined to form implementations not specifically described herein.

The details of one or more implementations are set forth in the accompanying drawings and the description below. Other features, objects and advantages will be apparent from the description and drawings, and from the claims.

Figure 1:
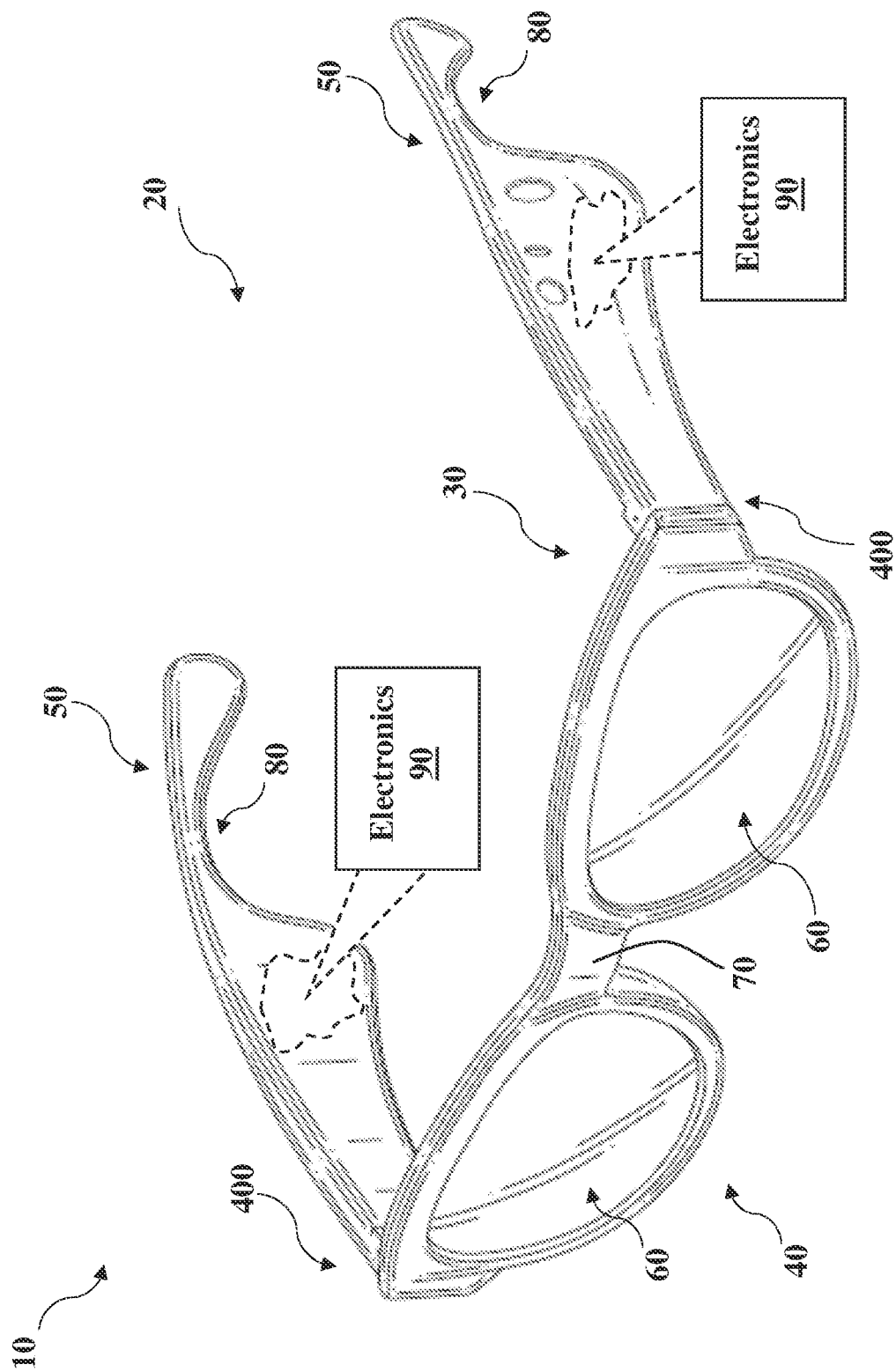
FIG. 1 shows a schematic depiction of a wearable audio device according to various implementations.

It is noted that the drawings of the various implementations are not necessarily to scale. The drawings are intended to depict only typical aspects of the disclosure, and therefore should not be considered as limiting the scope of the invention. In the drawings, like numbering represents like elements between the drawings.

DETAILED DESCRIPTION

As noted herein, various aspects of the disclosure generally relate to wearable audio devices such as audio eyeglasses or audio headsets with through-hinge wiring. More particularly, aspects of the disclosure relate to wearable audio devices having a hinge with an insert for managing a minimum bend radius of a cable and/or a cable management feature. In some cases, the hinge includes a metal ledge that extends around the interface between sections of the wearable audio device.

Commonly labeled components in the FIGURES are considered to be substantially equivalent components for the purposes of illustration, and redundant discussion of those components is omitted for clarity. Numerical ranges and values described according to various implementations are merely examples of such ranges and values, and are not intended to be limiting of those implementations. In some cases, the term "approximately" is used to modify values, and in these cases, can refer to that value+/−a margin of error, such as a measurement error. It is understood that the terms "inboard" and "outboard" are used to describe the radial location of components relative to the central axis (A), such that relative to the axis (A), a component that is radially inboard of a distinct component is closer to the central axis (A) on a radial (perpendicular) line that extends from the axis (A). The term "radially oriented" can be used to refer to a component, line, or plane that is perpendicular to an axis such as a central axis (A).

Components shown and described herein can be formed according to various manufacturing techniques, for example, molding, casting, additive manufacturing (e.g., 3D printing), etc. Where specific techniques are not described, conventional manufacturing approaches can be used to form the components and structures disclosed according to various implementations. Particular implementations include manufacturing approaches such as overmolding, where a first portion of the component (substrate) is partially or fully covered by a subsequently formed portion of the component (overmold).

Aspects and implementations disclosed herein may be applicable to a wide variety of speaker systems, such as wearable audio devices in various form factors, with particular application to audio eyeglasses or other head-mounted audio devices. Unless specified otherwise, the term wearable audio device, as used in this document, includes headphones and various other types of personal audio devices such as head, shoulder or body-worn acoustic devices that include one or more acoustic drivers to produce sound, with or without contacting the ears of a user. Some aspects disclosed may be particularly applicable to personal (wearable) audio devices such as audio eyeglasses or other head-mounted audio devices. It should be noted that although specific implementations of speaker systems primarily serving the purpose of acoustically outputting audio are presented with some degree of detail, such presentations of specific implementations are intended to facilitate understanding through provision of examples and should not be taken as limiting either the scope of disclosure or the scope of claim coverage.

Aspects and implementations disclosed herein may be applicable to speaker systems that either do or do not support two-way communications, and either do or do not support active noise reduction (ANR). For speaker systems that do support either two-way communications or ANR, it is intended that what is disclosed and claimed herein is applicable to a speaker system incorporating one or more microphones disposed on a portion of the speaker system that remains outside an ear when in use (e.g., feedforward microphones), on a portion that is inserted into a portion of an ear when in use (e.g., feedback microphones), or disposed on both of such portions. Still other implementations of speaker systems to which what is disclosed and what is claimed herein is applicable will be apparent to those skilled in the art.

Particular example implementations relate to off-ear headphones that produce sound using an acoustic driver that is spaced (or, separated) from the ear of the user while in use. Examples of off-ear headphones with dipole loudspeakers are disclosed in U.S. Pat. No. 9,794,676 and U.S. patent application Ser. No. 15/375,119, both of which are herein incorporated by reference in their entireties. Additional aspects of off-ear headphones are described in U.S. patent application Ser. No. 15/884,924 and U.S. patent application Ser. No. 15/992,982, both of which are herein also incorporated by reference in their entirety. Additionally, designs of particular off-ear headphones are included in U.S. Design patent application No. 29/639,191, which is herein also incorporated by reference in its entirety. Even further, examples of wearable audio device hinges are disclosed in U.S. patent application Ser. No. 16/442,813, which is herein also incorporated by reference in its entirety.

The wearable audio devices disclosed herein can include additional features and capabilities not explicitly described. That is, the wearable audio devices described according to various implementations can include features found in one or more other wearable electronic devices, such as smart glasses, smart watches, etc., or any other wearable audio device where wiring to components (e.g., printed circuit board assembly/assemblies (PCBA) and/or other electronic components such as an electro-acoustic transducer) must pass through a hinge. These wearable audio devices can include additional hardware components, such as one or more cameras, location tracking devices, microphones, etc., and may be capable of voice recognition, visual recognition, and other smart device functions. The description of wearable audio devices included herein is not intended to exclude these additional capabilities in such a device.

FIG. 1 is a schematic depiction of a wearable audio device 10 according to various implementations. In this example implementation, the wearable audio device 10 is a pair of audio eyeglasses 20. As shown, the wearable audio device 10 can include a frame 30 having a first section (e.g., lens section) 40 and at least one additional section (e.g., arm sections) 50 extending from the first section 40. In this example, as with conventional eyeglasses, the first (or, lens) section 40 and additional section(s) (arms) 50 are designed for resting on the head of a user. In this example, the lens section 40 can include a set of lenses 60, which can include prescription, non-prescription and/or light-filtering lenses, as well as a bridge 70 (which may include padding) for resting on the user's nose. Arms 50 can include a contour 80 for resting on the user's respective ears.

Contained within the frame 30 (or substantially contained, such that a component can extend beyond the boundary of the frame) are electronics 90 and other components for controlling the wearable audio device 10 according to particular implementations. In some cases, separate, or duplicate sets of electronics 90 are contained in portions of the frame, e.g., each of the respective arms 50 in the frame 30. However, certain components described herein can also be present in singular form.

Figure 2:
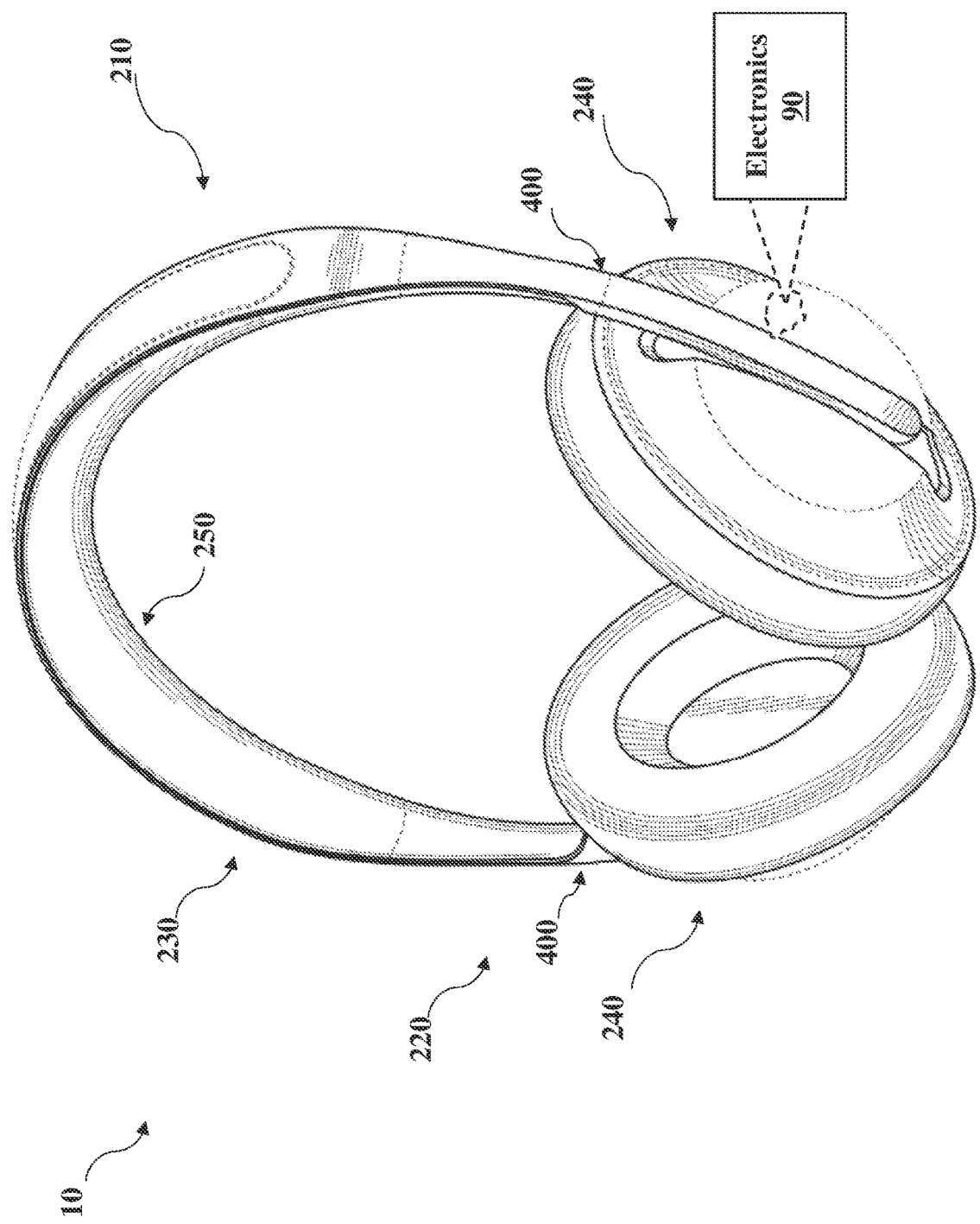
FIG. 2 is a schematic depiction of a wearable audio device according to various additional implementations.

While various implementations described herein refer to wearable audio devices in the form of audio eyeglasses, it is understood that the disclosed principles can be equally applied to a number of wearable audio devices in different form factors. For example, FIG. 2 depicts another example wearable audio device 10 in the form of headphones 210. In some cases, the headphones 210 include on-ear or around-ear headphones 210. The headphones 210 can include a frame 220 with a first section (e.g., headband) 230 and at least one additional section (e.g., earcup(s)) 240 extending from the first section 230. In various implementations, the headband 230 includes a head cushion 250. Stored within one or both of the earcups 240 are electronics 90 and other components for controlling the wearable audio device 10 according to particular implementations.

Figure 3:
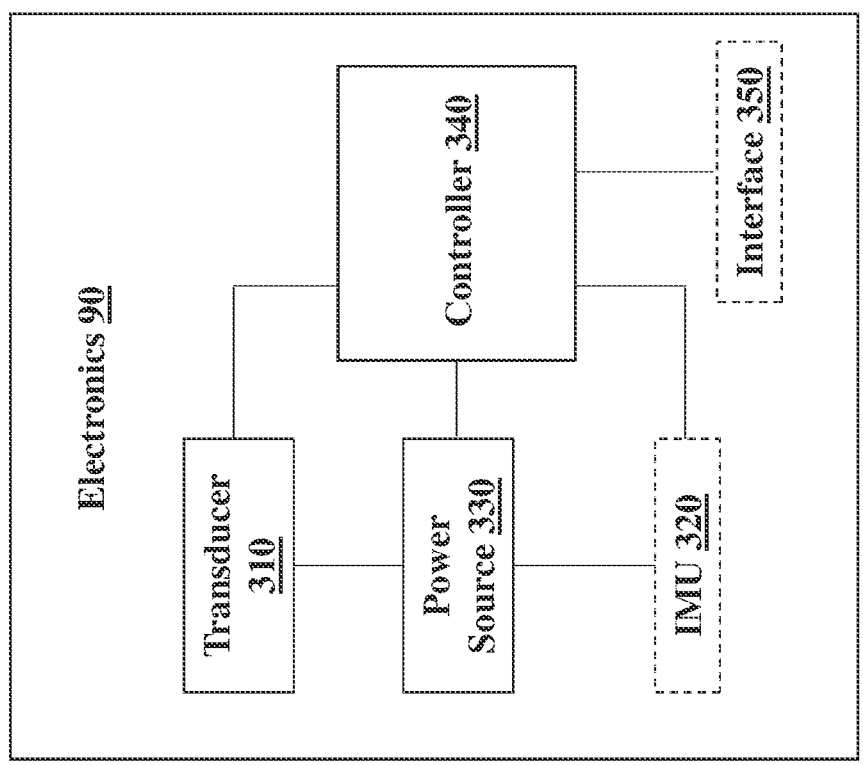
FIG. 3 is a schematic depiction of select electronics substantially contained in the wearable audio devices of FIGS. 1 and 2.

FIG. 3 shows a schematic depiction of the electronics 90 contained within the frame 30 (FIG. 1) and/or the frame 220 (FIG. 2). It is understood that one or more of the components in electronics 90 may be implemented as hardware and/or software, and that such components may be connected by any conventional means (e.g., hard-wired and/or wireless connection). It is further understood that any component described as connected or coupled to another component in the wearable audio device 10 or other systems disclosed according to implementations may communicate using any conventional hard-wired connection and/or additional communications protocols. In various particular implementations, separately housed components in wearable audio device 10 are configured to communicate using one or more conventional wireless transceivers.

As shown in FIG. 3, electronics 90 contained within the frame 20 (FIG. 1) can include a transducer 310 (e.g., electro-acoustic transducer), an inertial measurement unit (IMU) 320 (optional, depicted in phantom), and a power source 330. In various implementations, the power source 330 is connected to the transducer 310, and can additionally be connected to the IMU 320. Each of the transducer 310, IMU 320 and power source 330 are connected with a controller 340, which is configured to perform control functions according to various implementations described herein. Electronics 90 can include other components not specifically depicted herein, such as communications components (e.g., a wireless transceiver (WT)) configured to communicate with one or more other electronic devices connected via one or more wireless networks (e.g., a local WiFi network, Bluetooth connection, or radio frequency (RF) connection), and amplification and signal processing components. It is understood that these components or functional equivalents of these components can be connected with, or form part of, the controller 340. In additional optional implementations, the electronics 90 can include an interface 350 coupled with the controller 340 for enabling functions such as audio selection, powering on the audio eyeglasses or engaging a voice control function. In certain cases, the interface 350 includes a button, a compressible interface and/or a capacitive touch interface. Various additional functions of the electronics 90 are described in U.S. patent application Ser. No. 16/442,813, previously incorporated by reference herein.

Shown in FIGS. 1 and 2, the wearable audio device 10 can include a hinge 400 coupling the first section (e.g., lens section 40 in FIG. 1, or headband 230 in FIG. 2) with the additional section(s) (e.g., arms 50 in FIG. 1, or earcups 240 in FIG. 2). In various implementations, the wearable audio device 10 includes multiple hinges 400, e.g., between a lens section 40 and each of the arms 50 in the audio eyeglasses 20 (FIG. 1), or between the headband 230 and each of the earcups 240 (FIG. 2). In the example of the audio eyeglasses 20, a portion of the hinge 400 can be fixed within a slot in the lens section 40.

In various implementations, as noted herein, the hinge 400 is configured to enable wiring to run therethrough, for example, between sections in the wearable audio device 10. As described herein, one or more portions of the frame 20, as well as the hinge 400, can be formed substantially of a plastic or composite material.

Figure 4:
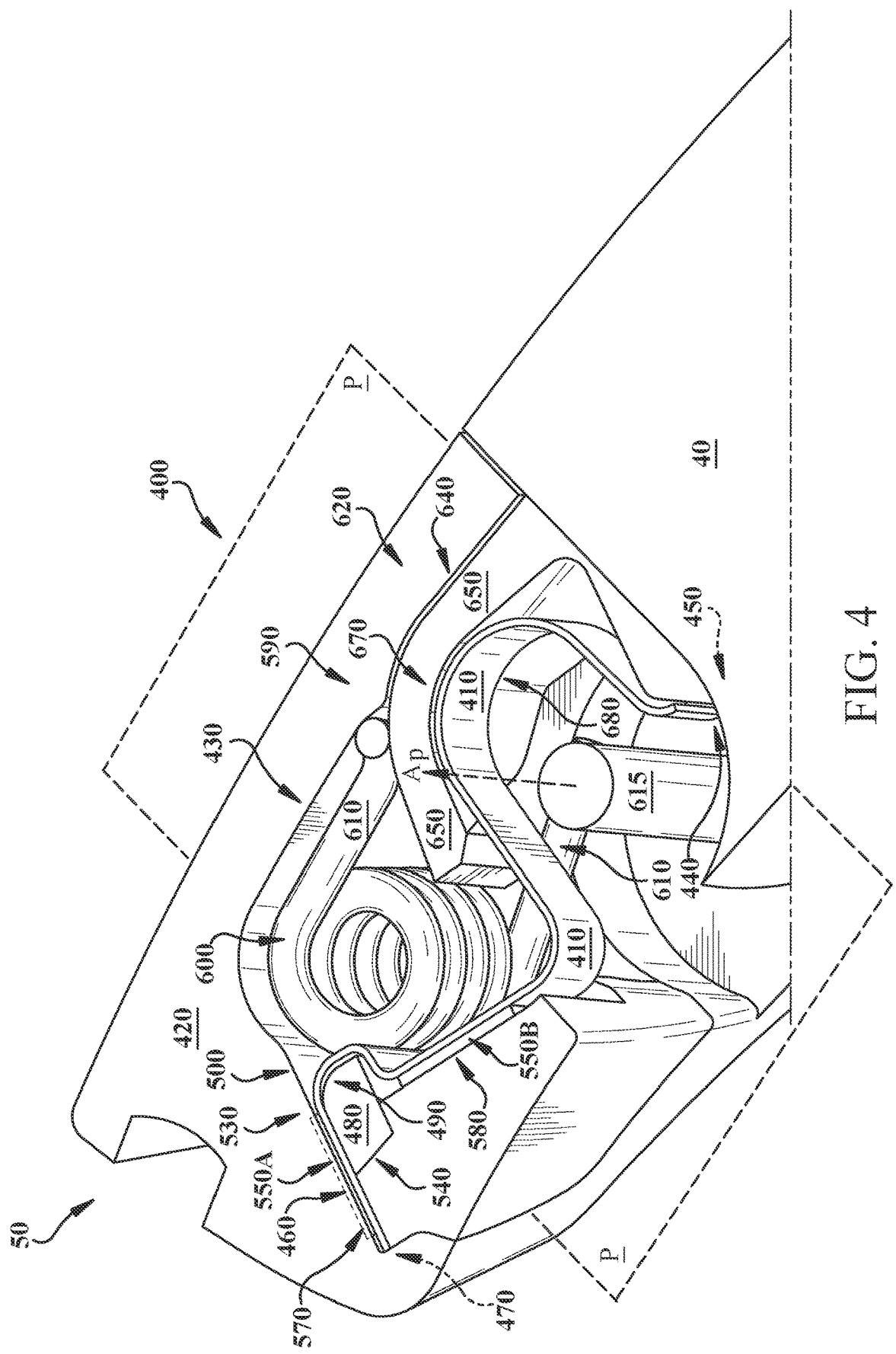
FIG. 4 shows a cut-away perspective view of a hinge in a wearable audio device according to various implementations.
Figure 5:
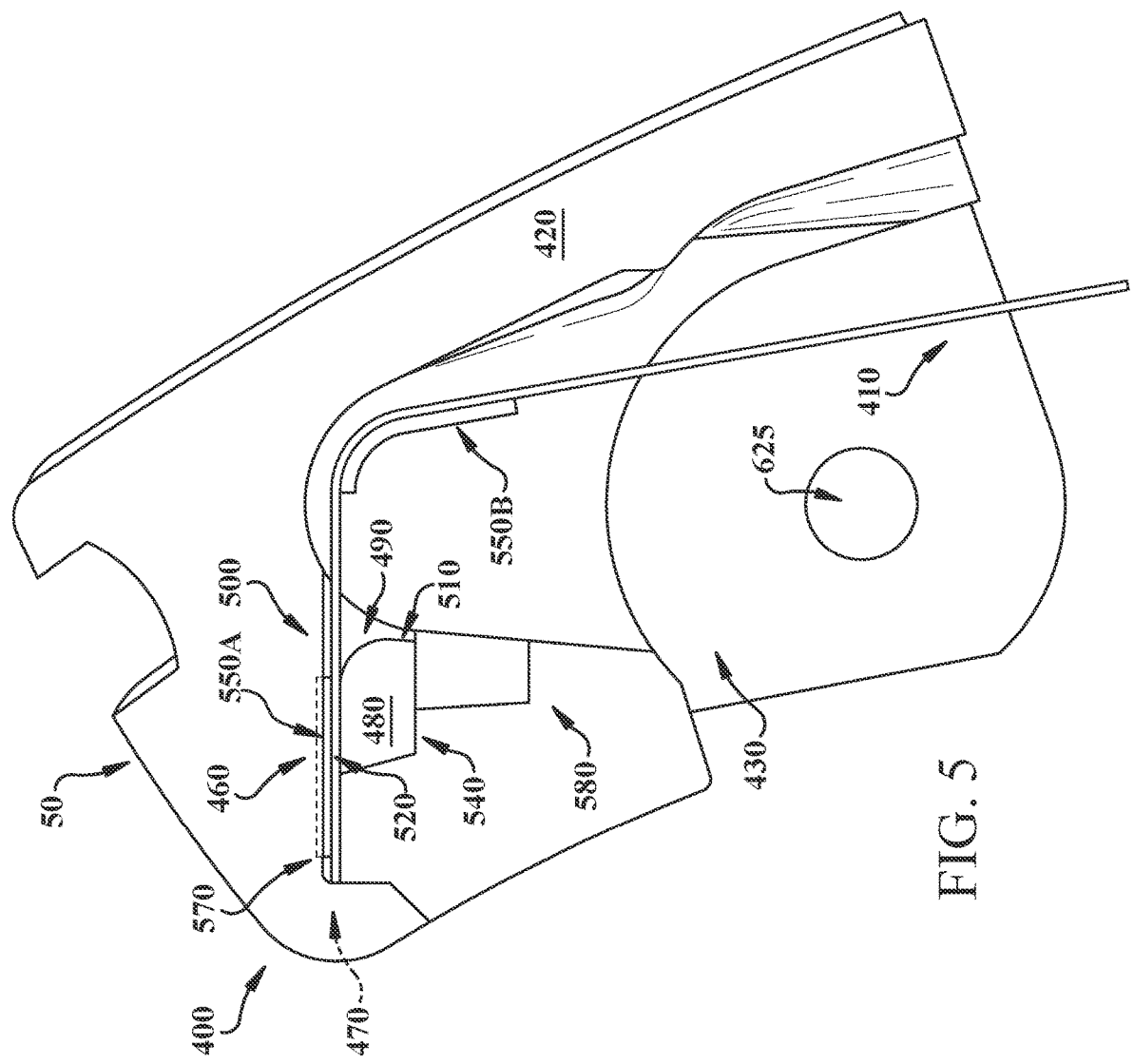
FIG. 5 is a plan view of a portion of the hinge in FIG. 4.
Figure 6:
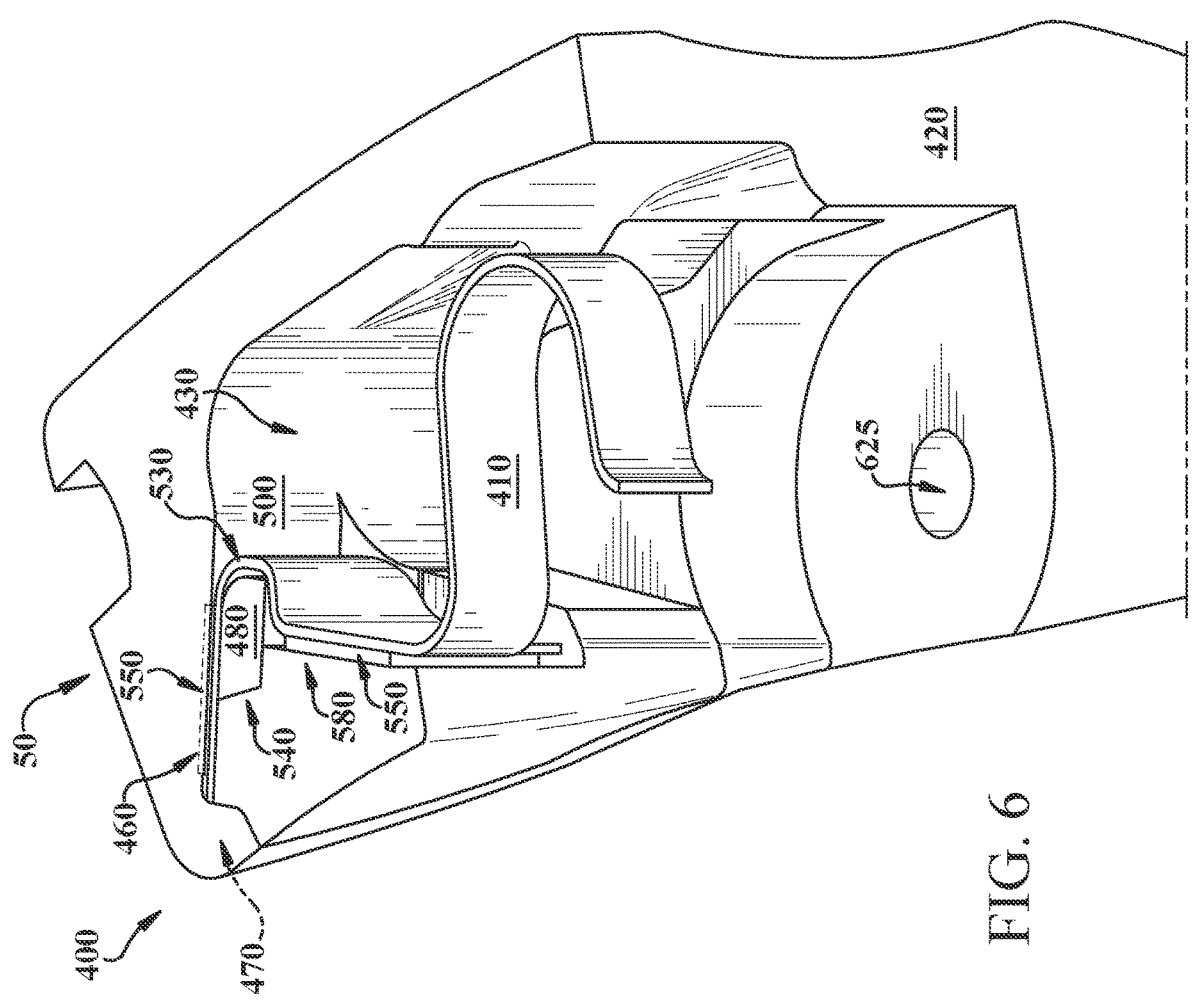
FIG. 6 is a perspective view of a portion of a hinge according to various implementations.
Figure 7:
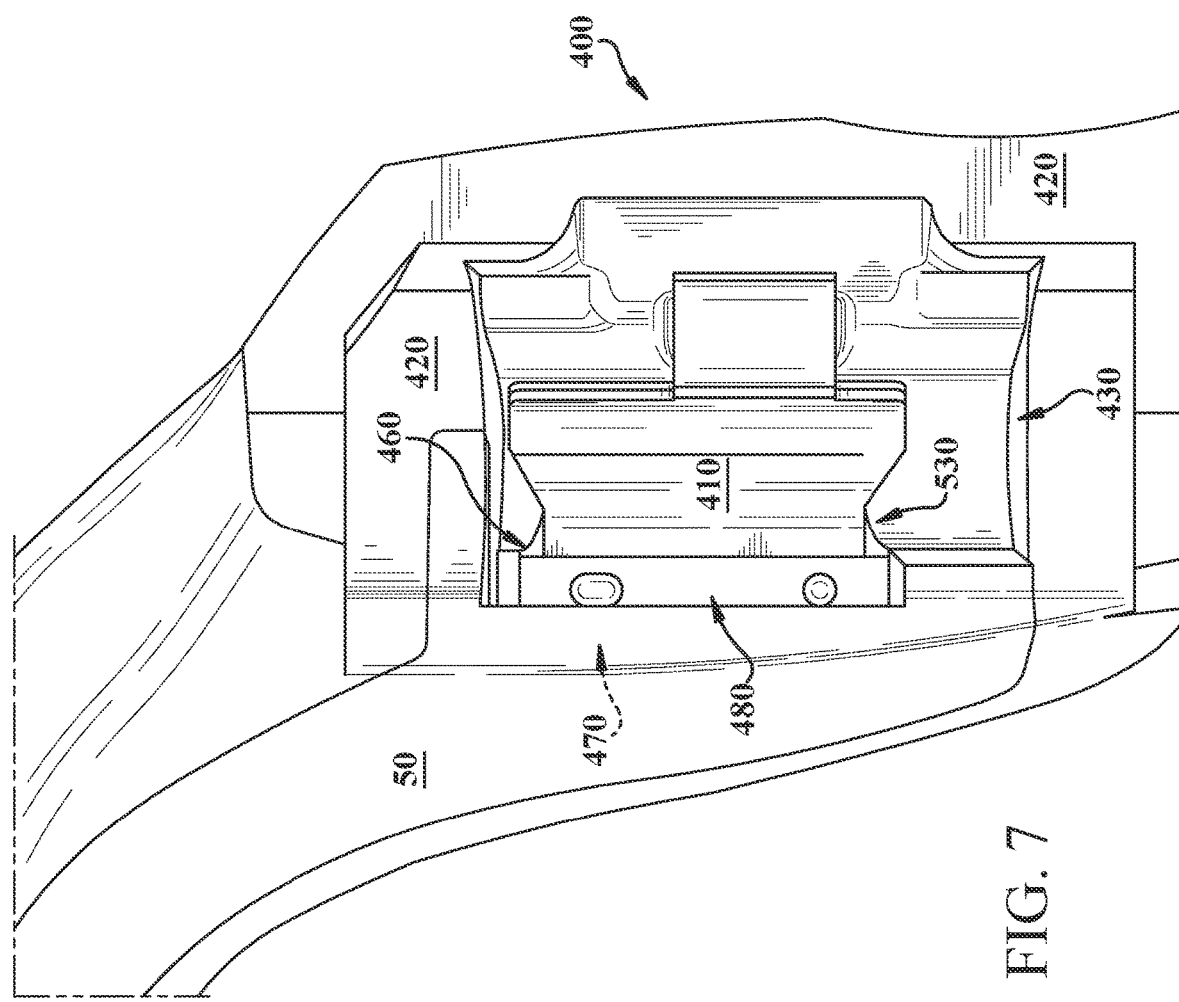
FIG. 7 is a perspective view of another portion of a hinge according to various implementations.

Turning to FIG. 4, a cut-away perspective view of the hinge 400 is shown according to various implementations. In the example depiction of the audio eyeglasses 20 in FIG. 1, the hinge 400 is shown joining the lens section 40 with arms 50. In particular cases, the hinge 400 is integral with each of the arm(s) 50. In other implementations, portions of the hinge 400 are integral with each of the lens section 40 and the arms 50, respectively. In the depiction of the hinge 400 in FIG. 4, the hinge 400 is in a substantially open position. As discussed further herein, the hinge 400 can permit movement (e.g., pivoting) of the first section of the wearable audio device 10 (FIGS. 1 and 2) relative to an additional section of the wearable audio device 10, but can be configured to accommodate a cable 410 extending through the hinge 400, e.g., to connect to one or more components in the electronics 90 (FIG. 1) in device sections. FIG. 5 illustrates a different cut-away perspective view of the hinge 400, removing illustration of the hinge mechanism and cable management feature that are present in FIG. 4. FIG. 6 shows the hinge 400 during a preliminary formation process. FIG. 7 is a perspective view of a portion of the hinge 400 and the cable 410 where the cable 410 enters the arm 50 of the audio eyeglasses 20 in FIG. 1. These FIGURES are referred to simultaneously.

As illustrated in FIG. 4, the hinge 400 can include a body 420 defining a cavity 430 for accommodating the cable 410. The body 420 can be formed of one or more conventional materials used in the eyeglasses industry, such as plastics or composites. The cavity 430 is sized to accommodate the cable 410 extending therethrough, i.e., the cavity 430 has a first opening 440 to a pathway 450 (obstructed in these views) in the first section (e.g., lens section 40, FIG. 1) and a second opening 460 to an additional pathway 470 (obstructed in these views) in the additional section (e.g., arm section 50, FIG. 1). In various implementations, the cable 410 includes a flexible printed circuit (FPC) for connecting different components in the electronics 90, and/or connecting electronics 90 in different sections of the wearable audio device 10 (FIG. 1, FIG. 2). In certain implementations where the cable 410 includes an FPC, that FPC can include a single-layer or multi-layer FPC. In other cases, the cable 410 includes one or more wire(s), or one or more cable(s), which may be packaged in an assembly. In some particular cases, the cable 410 (e.g., FPC, wire(s), and/or cable(s)) is thinner in a region contained within the hinge 400 than in a distinct region within the pathway 450 or the additional pathway 470. In these implementations where the cable 410 has a non-uniform thickness, thinner section(s) of the cable 410 reside within the hinge 400 than in other sections of the wearable audio device 10.

In various implementations, the hinge 400 includes an insert 480 located within the body 420 that is adjacent to the second opening 460. In particular cases, the insert 480 has an arcuate surface 490 that faces an opposing inner wall 500 of the cavity 430. However, in other cases, the arcuate surface 490 is a beveled or chamfered edge between approximately perpendicular sides 510, 520 (FIG. 5) of the insert 480. As described herein, the insert 480 defines a minimum radius of a bend 530 (FIG. 4, FIG. 6) in the cable 410 within the cavity 430. In particular cases, the arcuate surface 490 defines the minimum radius of the bend 530 in the cable 410, such that the cable 410 contacts the arcuate surface 490 along approximately an entirety of the length of that surface 490. The minimum radius of this bend 530 is defined within the hinge 400. That is, the hinge 400 is overmolded on the cable 410 such that the body 420 surrounds the portion of the cable 410 extending through the cavity 430. Additionally, the body 420 of the hinge 400 is overmolded on the insert 480, such that the body 420 surrounds the insert 480. In particular implementations, the body 420 includes an overmolded plastic, and the insert 480 is non-unitary with the body 420. That is, the insert 480 and the body 420 are originally formed as separate components. In certain cases, the body 420 and/or the insert 480 are formed of a plastic such as polycarbonate, acrylonitrile butadiene styrene, and/or polyamide. In particular implementations, the insert 480 is more rigid than the body 420, however, this is not necessary in all implementations. In various embodiments, the insert 480 fits in a slot 540 in the body 420. In other particular implementations, the insert 480 is insert-molded into the body 420, e.g., at the slot 540.

In certain implementations, the hinge 400 further includes one or more adhesive strip(s) 550 that couple the cable 410 to the hinge body 420. In certain implementations, the hinge 400 includes two distinct adhesive strips 550 coupling the cable 410 to distinct portions of the hinge body 420. In some cases, a first adhesive strip 550 couples the cable 410 to the body 420 proximate the second opening 460, e.g., ahead of the bend 530 when viewed from the second opening 460 into the body 420. This first adhesive strip 550A (FIG. 4) can be coupled to a first interior wall 570 of the body 420 that is located adjacent the insert 480. A second example adhesive strip 550B is shown coupling the cable 410 to a second interior wall 580 of the body 420 that is located past the bend 530 when viewed from the first opening 440 into the body 420. That is, the adhesive strips 550 couple the cable 410 to the body 420 on both sides of the insert 480. In some cases, the adhesive strips 550 couple the cable 410 to the body 420 on opposite sides of the cable 410. FIG. 5 illustrates the cable 410 with adhesive strips 550 and the insert 480 prior to applying the second adhesive strip 550B to the second interior wall 580. FIG. 6 illustrates the cable 410 after the second adhesive strip 550B is coupled with the second interior wall 580. FIG. 7 shows the cable 410 in isolation with the insert 480 in a portion of the body 420, for example, to illustrate the bend 530.

Returning to FIG. 4, it is understood that the minimum radius of the bend 530 is controlled by the insert 480 within the body 420 of the hinge 400, such that the cable 410 is bent at a defined radius prior to exiting the hinge 400, e.g., at the opening 460. This is in contrast to conventional overmolded cable configurations, where poorly defined bending occurs at the entry/exit of the component (e.g., hinge) or in a portion of the device where the cable is exposed. This can cause stress on the cable, as well as expose the cable to unwanted ambient conditions. That is, the overmolded cable configuration in the wearable audio devices 10 depicted herein can control the minimum radius of the bend 530 in the cable 410, which in certain implementations, is located within the body of the hinge 400, e.g., prior to exiting the hinge 400.

With continuing reference to FIG. 4, in various implementations the wearable audio device 10 further includes a hinge mechanism 590 contained within the body 420. In various implementations, the hinge mechanism 590 includes a spring, a set of interlocking arms or a tension member for enabling controlled movement of the second section (e.g., arm section 50) relative to the first section (e.g., lens section 40). It is understood that the hinge mechanism 590 can include any hinge component(s) that permit controlled rotation of a first section relative to a second section. In certain cases, as illustrated in the example in FIG. 4, the hinge mechanism 590 includes a spring (e.g., coil spring) 600 with a pair of lever arms 610 for controlling movement of the arm section 50 relative to the lens section 40. In certain cases, the spring 600 controls movement around a pin 615 or other pivot point (pin slot 625 shown in FIGS. 5 and 6). In particular cases, the hinge mechanism 590 has a primary axis (Ap) about which the arm section 50 moves relative to the lens section 40. In some cases, where the hinge mechanism includes a spring 600, the primary axis (Ap) is the axis about which the lever arms pivot (or, rotate). In some examples, the cable 410 wraps around the hinge mechanism 590 radially outboard relative to the primary axis (Ap).

The wearable audio device 10 can further include a cable management feature 620 contained within the body 420 of the hinge 400. In some cases, the cable management feature 620 utilizes the pin 615 extending vertically through the hinge 400 about which the cable 410 is routed. In some cases, the cable management feature 620 additionally, or alternatively, includes an arm 640 that extends within the cavity 430 and controls movement of the cable 410 as the arm 50 moves relative to lens section 40 (e.g., in the example depiction in FIG. 4). For example, the arm 640 can include a hook-shaped tab with a first section 650 and a second section 660 extending from the first section 650 at an angle. In particular implementations, the sections of the arm 640 form an arcuate interface 670 for introducing a second bend 680 in the cable 410. In some examples, as illustrated in FIG. 4, as the arm (of the audio eyeglasses) 50 moves relative to the lens section 40, the arm (of the cable management feature) 640 contacts a surface of the cable 410 and maintains the second bend 680 in the cable 410. In certain implementations, the cable management feature 620 remains in contact with the cable 410 throughout approximately an entire range of motion of the hinge 400.

In some examples, as shown in FIG. 4, the hinge mechanism 590, cable management feature 620 and cable 410 are all located in a common plane. In these examples, the common plane (P) is radially oriented relative to the primary axis (Ap) of the hinge mechanism 590, that is, the common plane (P) is perpendicular to the primary axis (Ap). In other words, a common plane (P) exists that runs perpendicular to the primary axis (Ap) and intersects each of the hinge mechanism 590, cable management feature 620 and cable 410. This is in contrast to conventional hinge mechanisms that dedicate separate axially oriented space to cable management, hinge mechanism and/or cable(s). In various implementations, aligning components in a common plane (P) can reduce the footprint of the hinge 400, simplify manufacturing processes for the hinge 400, and/or improve the robustness of the hinge 400.

Figure 8:
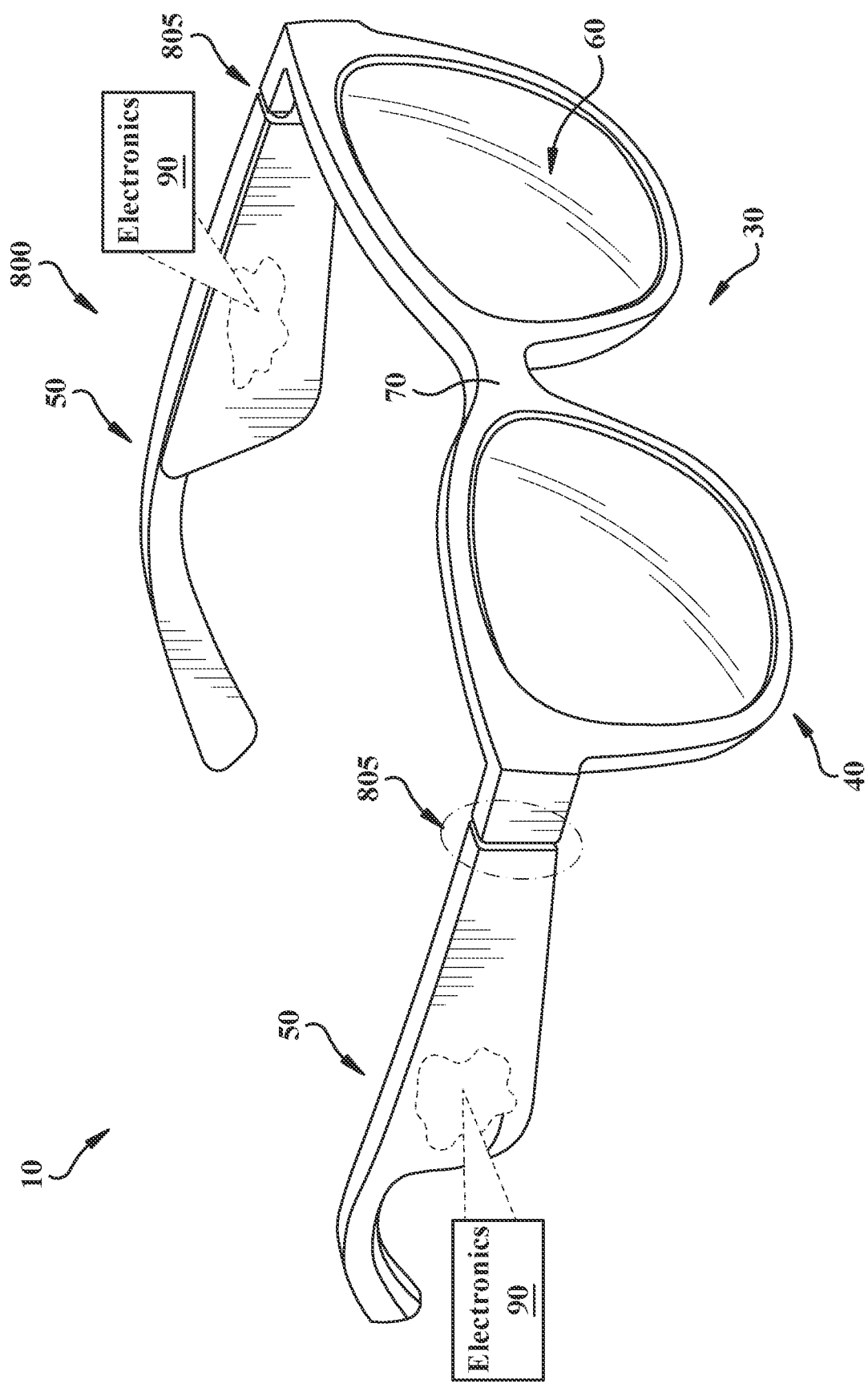
FIG. 8 is a schematic depiction of a wearable audio device according to various additional implementations.

FIG. 8 shows an additional implementation of an audio device 10, for example, a pair of audio eyeglasses 800. In these cases, the audio eyeglasses 800 can include a number of common features with the audio eyeglasses 20 depicted and described with reference to FIGS. 1 and 3. Redundant explanation of these components is omitted.

Figure 9:
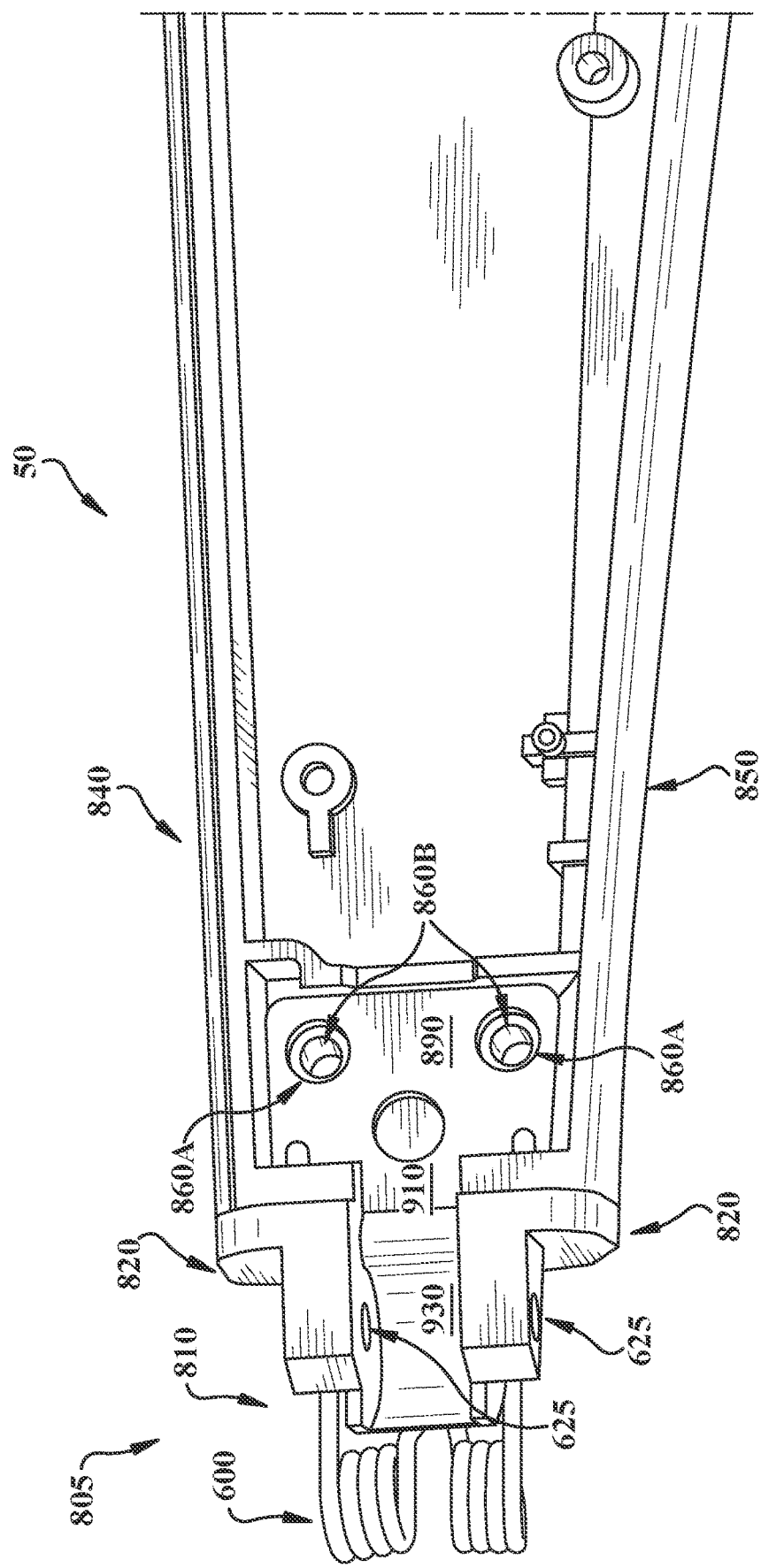
FIG. 9 shows a cut-away perspective of a hinge coupled with a section of a wearable audio device according to various implementations.
Figure 10:
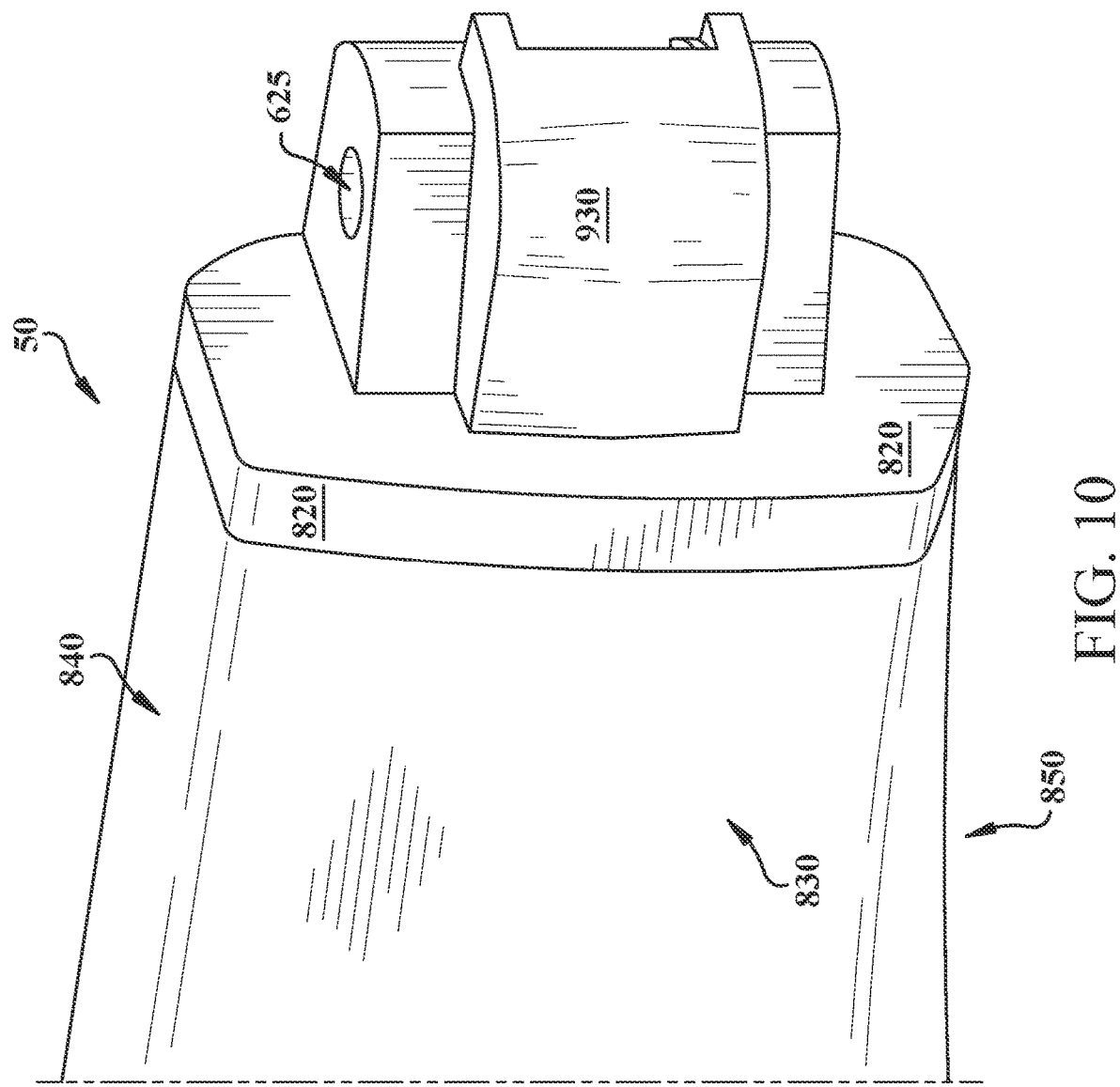
FIG. 10 shows a distinct perspective of the hinge and the section depicted in FIG. 9.

The audio eyeglasses 800 depicted in FIG. 8 can include a hinge 805 similarly described with reference to FIGS. 1 and 4-7. FIG. 9 shows a cut-away view of a portion of the hinge 805 along with the second (e.g., arm) section 50 from the perspective of the inside of the arm 50. FIG. 10 shows a portion of the hinge 805 coupled with the arm 50, from the perspective of the outside of the arm 50. These FIGURES are referred to simultaneously. In these implementations, the hinge 805 includes a hinge mechanism 810 that includes metal ledge 820 separating the first (or, lens) section 40 and each additional section (arm) 50. In various implementations, the metal ledge 820 is visible around an entirety of an interface 830 (e.g., vertical interface) between the first section 40 and the additional section 50 while the hinge 805 is in the fully open position. The metal ledge 820 is illustrated as visible proximate the outer facing surface 830 as well as the top and bottom surfaces 840, 850 of the arm 50 in FIG. 10. In various particular implementations, the metal ledge 820 remains stationary and in contact with the arm 50 throughout an entire range of motion of the hinge 805.

As shown in FIG. 9, in these implementations, the hinge mechanism 810 is coupled with the arm 50 by a first set of mating features 860. This first set of mating features 860 are further illustrated in FIGS. 11 and 12, which show a portion of the arm 50 in isolation. Mating features 860 on the hinge mechanism 810 are denoted with an "A", while mating features on the arm 50 are denoted with a "B". In this example, mating feature(s) 860A can include one or more slots while mating feature(s) 860B can include a protrusion such as a tab, bump or pillar, which in some cases includes a counter-bore for receiving a fastener 870 (FIG. 13) such as a screw, bolt, pin, rivet, etc. In various implementations, the mating features 860A on the hinge mechanism 810 are sized to receive the mating features 860B on the arm 50, e.g., as a male-female coupling. In certain cases, the mating features 860B on the arm 50 include an internal slot or groove 880 for receiving the fastener 870 (FIG. 13). In particular aspects, the mating features 860A on the hinge mechanism 810 are part of a plate 890 that fits within a slot 900 in the arm 50. The plate 890 can include a thinned section 910 extending through, and complementing, the slot 900.

Figure 11:
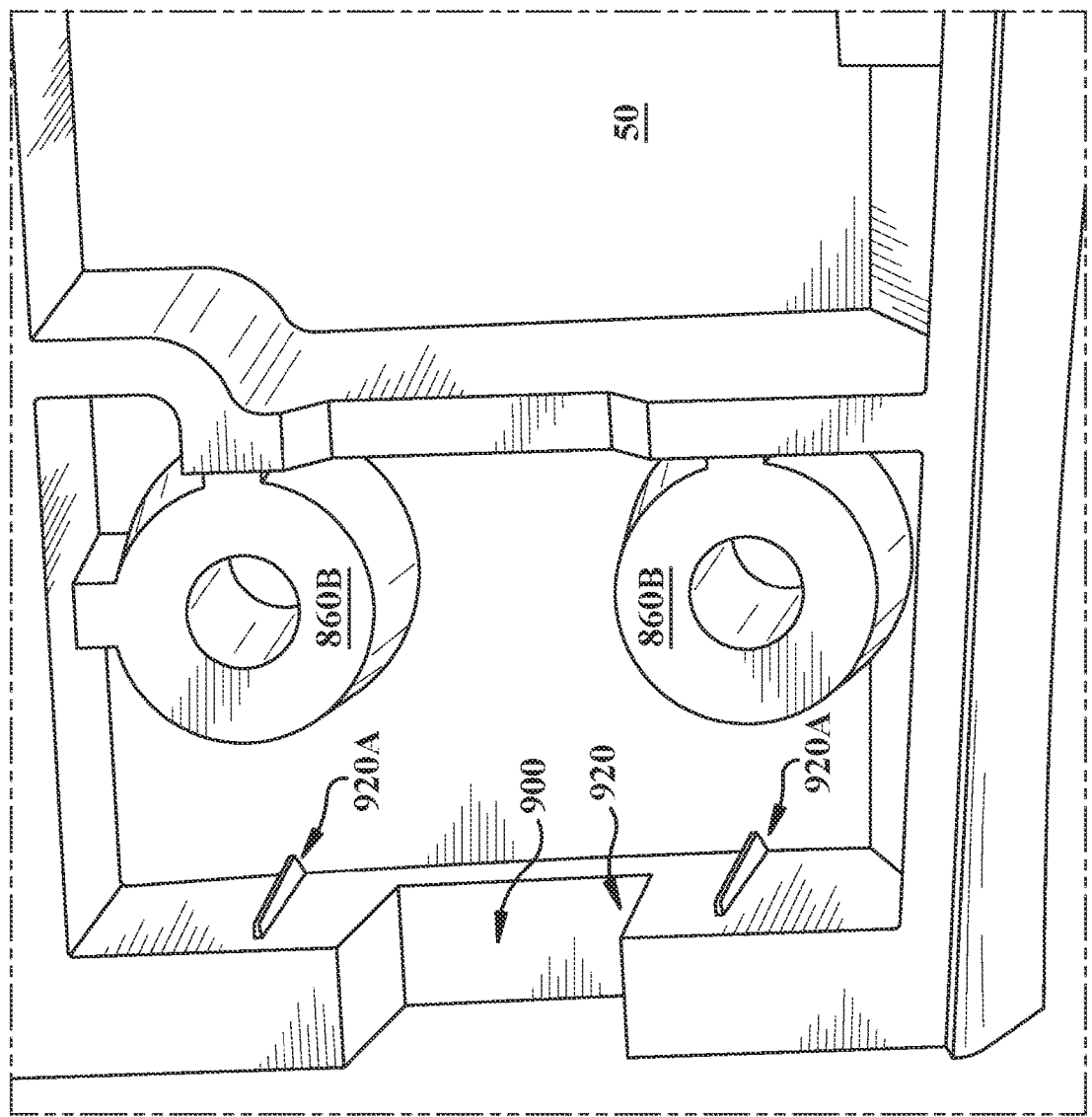
FIG. 11 is a close-up perspective of a section of a wearable audio device according to various implementations.
Figure 12:
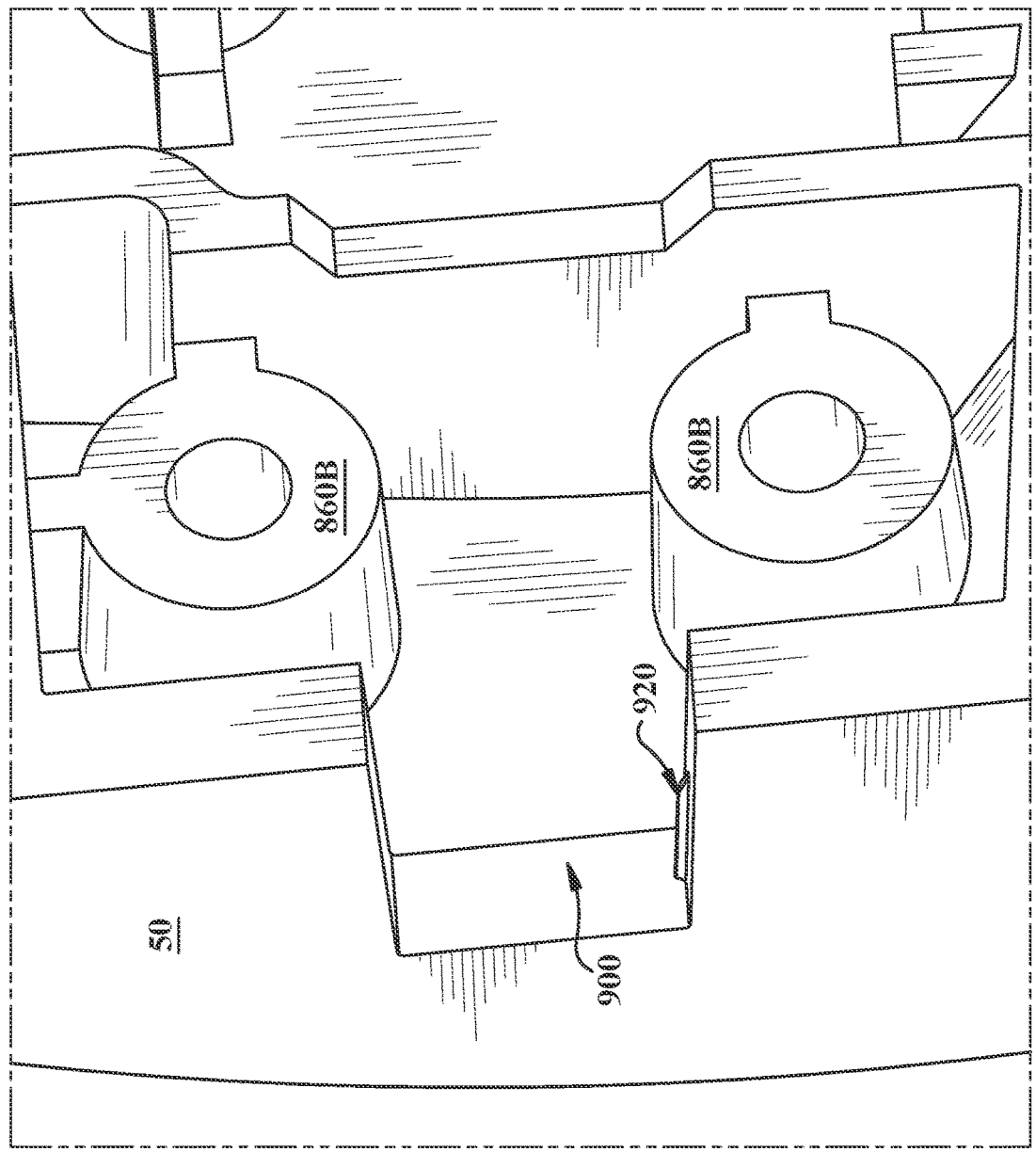
FIG. 12 shows the section depicted in FIG. 11 from a distinct perspective.
Figure 13:
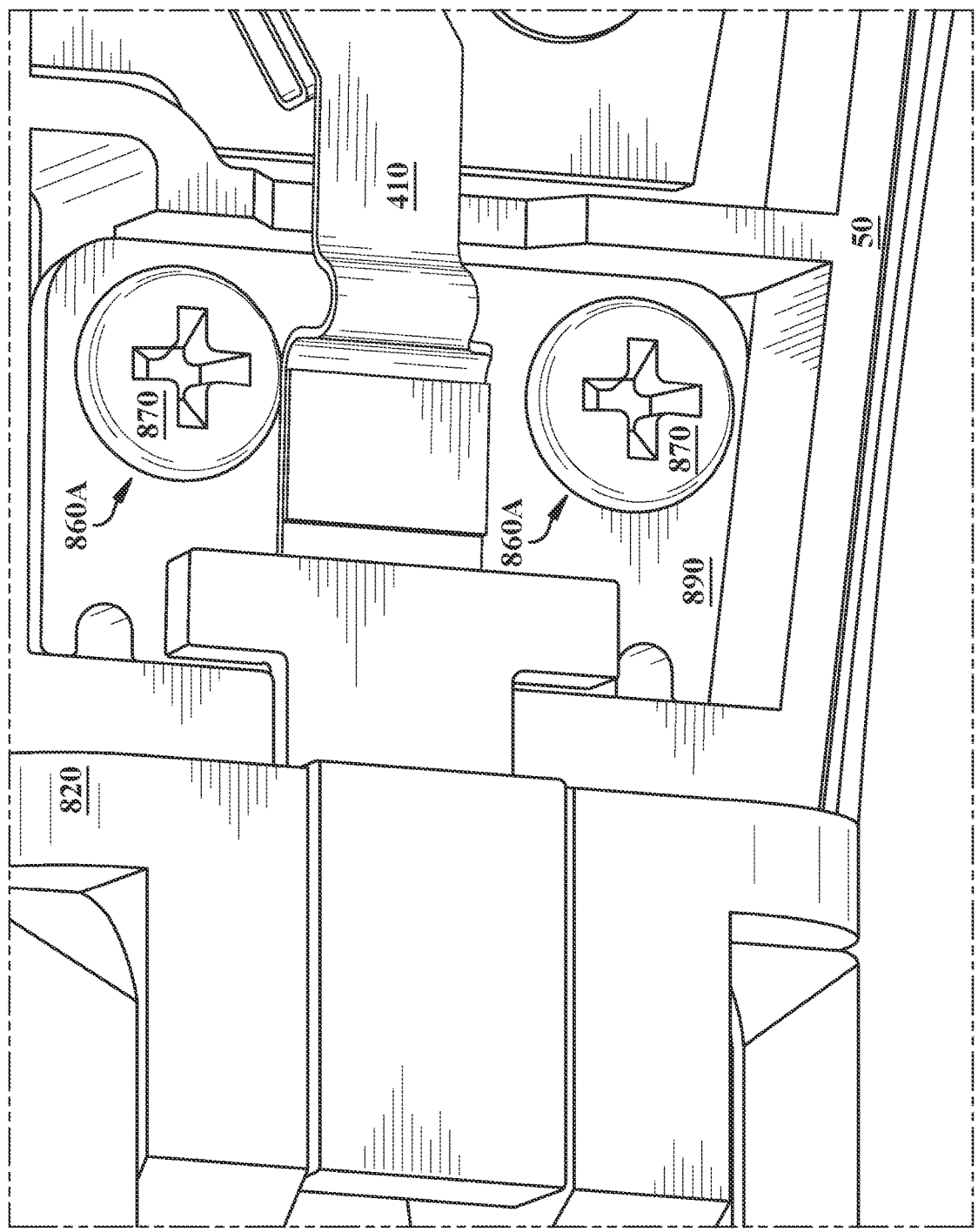
FIG. 13 is a close-up cut-away perspective of a hinge according to various implementations.

In various implementations, the hinge 805 additionally includes another set of mating features 920, illustrated in detail in FIGS. 11 and 12. In these cases, the mating features 920 includes a set of ribs configured to improve the fit of the plate 890 within the recess in the arm 50. In particular cases, these mating features 920 (e.g., ribs) are located along one or more interior surfaces of the arm 50, and in some cases, such as illustrated with mating features 920A, are vertically aligned with mating features 860B on the arm 50. Additionally, as shown in FIG. 12, a mating feature 920 such as a rib can be located in the slot 900 to contact the thinned section 910.

In certain implementations, as illustrated in FIG. 9, the hinge 805 includes a cable management feature 930 located on a distinct side of the slot 900 from the mating features 860A, 860B. In certain implementations, the cable management feature 930 and the hinge mechanism 810 are unitary and formed of a metal. FIG. 13 shows a close-up perspective view of the hinge 805 including the cable 410. As described with reference to hinge 80 in FIGS. 3-7, the cable management feature 930, hinge mechanism 810 and cable 410 (FIG. 13) in the hinge 805 are all located in a common plane (P).

In various implementations, the hinge 805 enables smooth, controlled movement of the arm 50 relative to the lens region 40 while obstructing the cable 410 from view. Additionally, the hinge 805 is configured to maintain the position of the metal ledge 820 through the entire range of motion.

According to various implementations, the hinges shown and described can enhance manufacturability, longevity and functionality relative to conventional audio device hinges. In various implementations, the hinges shown and described herein mitigate wear on the cable during use of the wearable audio device(s), and enable routing of the cable through the hinge while efficiently using vertical space. This enables a more compact, functional configuration when compared with conventional audio device cable-through hinges.

In various implementations, components described as being "coupled" to one another can be joined along one or more interfaces. In some implementations, these interfaces can include junctions between distinct components, and in other cases, these interfaces can include a solidly and/or integrally formed interconnection. That is, in some cases, components that are "coupled" to one another can be simultaneously formed to define a single continuous member. However, in other implementations, these coupled components can be formed as separate members and be subsequently joined through known processes (e.g., soldering, fastening, ultrasonic welding, bonding). In various implementations, electronic components described as being "coupled" can be linked via conventional hard-wired and/or wireless means such that these electronic components can communicate data with one another. Additionally, sub-components within a given component can be considered to be linked via conventional pathways, which may not necessarily be illustrated.

Other embodiments not specifically described herein are also within the scope of the following claims. Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

We claim:

1. A wearable audio device, comprising:
    a frame for resting on a head of a user, the frame comprising:
        a first section; an additional section extending from the first section; a hinge coupling the first section and the additional section; and a cable extending through the hinge,
        wherein the hinge is overmolded on the cable and comprises:
            a body defining a cavity accommodating the cable, the cavity having a first opening to a pathway in the first section, and a second opening to an additional pathway in the additional section;
            an insert within the body and adjacent the first opening, the insert defining a minimum radius of a bend in the cable within the cavity;
            a hinge mechanism contained within the body; and
            a cable management feature contained within the body, wherein the hinge mechanism, the cable management feature and the cable are all located in a common plane that is radially oriented relative to a primary axis of the hinge mechanism.

2. The wearable audio device of claim 1, wherein the wearable audio device comprises audio eyeglasses, wherein the first section comprises a lens region, the additional section comprises an arm, and the hinge couples the lens region with the arm, and wherein a portion of the hinge is fixed within a slot in the lens region.

3. The wearable audio device of claim 1, wherein the wearable audio device comprises a headset, wherein the first section comprises a headband, the additional section comprises an earphone, and the hinge couples the headband with the earphone.

4. The wearable audio device of claim 1, further comprising:
    an electro-acoustic transducer at least partially housed in the frame and comprising a sound-radiating surface for providing an audio output.

5. The wearable audio device of claim 1, wherein the hinge permits movement of the additional section relative to the first section.

6. The wearable audio device of claim 1, further comprising at least one microphone in the first section or the additional section.

7. The wearable audio device of claim 1, wherein the cable comprises a flexible printed circuit (FPC), and wherein the FPC is thinner in a region contained within the hinge than in a distinct region within the pathway or the additional pathway.

8. The wearable audio device of claim 1, wherein the body of the hinge comprises an overmolded plastic, wherein the insert is non-unitary with the body, and wherein the overmolded body of the hinge envelops the insert.

9. The wearable audio device of claim 1, wherein the cable wraps around the hinge mechanism radially outboard relative to the primary axis of the hinge mechanism about which the additional section moves relative to the first section.

10. The wearable audio device of claim 1, wherein the hinge comprises a metal ledge separating the first section and the additional section, wherein the metal ledge is visible around an entirety of an interface between the first section and the additional section while the hinge is in a fully open position,
    wherein the cable management feature and the hinge mechanism are unitary and formed of a metal, and wherein the hinge includes a set of mating features that are coupled with a complementary set of mating features in the additional section.

11. A wearable audio device, comprising:
    a frame for resting on a head of a user, the frame comprising:
        a first section; an additional section extending from the first section; a hinge coupling the first section and the additional section; and a cable extending through the hinge,
        wherein the hinge is overmolded on the cable and comprises:
            a body defining a cavity accommodating the cable, the cavity having a first opening to a pathway in the first section, and a second opening to an additional pathway in the additional section; and
            an insert within the body and adjacent the first opening, the insert defining a minimum radius of a bend in the cable within the cavity.

12. The wearable audio device of claim 11, wherein:
    a) the wearable audio device comprises audio eyeglasses, wherein the first section comprises a lens region, the additional section comprises an arm, and the hinge couples the lens region with the arm; or
    b) the wearable audio device comprises a headset, wherein the first section comprises a headband, the additional section comprises an earphone, and the hinge couples the headband with the earphone.

13. The wearable audio device of claim 11, further comprising:
    an electro-acoustic transducer at least partially housed in the frame and comprising a sound-radiating surface for providing an audio output; and
    at least one microphone in the first section or the additional section.

14. The wearable audio device of claim 11, wherein the hinge permits movement of the additional section relative to the first section, and wherein the cable comprises a flexible printed circuit (FPC).

15. The wearable audio device of claim 11, wherein the body of the hinge comprises an overmolded plastic, wherein the insert is non-unitary with the body, and wherein the overmolded body of the hinge envelops the insert.

16. The wearable audio device of claim 11, wherein the insert and the cable are located in a common plane that is radially oriented relative to a primary axis of the hinge.

17. A wearable audio device, comprising:
a frame for resting on a head of a user, the frame comprising:
  a first section; an additional section extending from the first section; a hinge coupling the first section and the additional section; and a cable extending through the hinge,
  wherein a portion of the hinge is overmolded on the cable and comprises:
    a body defining a cavity accommodating the cable, the cavity having a first opening to a pathway in the first section, and a second opening to an additional pathway in the one additional section;
    a hinge mechanism contained within the body; and
    a cable management feature contained within the body, wherein the hinge mechanism, the cable management feature and the cable are all located in a common plane that is radially oriented relative to a primary axis of the hinge mechanism.

18. The wearable audio device of claim 17, wherein:
a) the wearable audio device comprises audio eyeglasses, wherein the first section comprises a lens region, the additional section comprises an arm, and the hinge couples the lens region with the arm; or
b) the wearable audio device comprises a headset, wherein the first section comprises a headband, the additional section comprises an earphone, and the hinge couples the headband with the earphone.

19. The wearable audio device of claim 17, further comprising:
an electro-acoustic transducer at least partially housed in the frame and comprising a sound-radiating surface for providing an audio output; and
at least one microphone in the first section or the additional section.

20. The wearable audio device of claim 17, wherein the cable wraps around the hinge mechanism radially outboard relative to the primary axis of the hinge mechanism about which the additional section moves relative to the first section.

21. The wearable audio device of claim 17, wherein the hinge comprises a metal ledge separating the first section and the additional section, wherein the metal ledge is visible around an entirety of an interface between the first section and the additional section while the hinge is in a fully open position.

22. The wearable audio device of claim 17, wherein the cable management feature and the hinge mechanism are unitary and formed of a metal, and wherein the hinge includes a set of mating features that are coupled with a complementary set of mating features in the additional section.

* * * * *